(12) United States Patent
Kim et al.

(10) Patent No.: US 8,154,331 B2
(45) Date of Patent: Apr. 10, 2012

(54) DUTY CORRECTION CIRCUIT

(75) Inventors: Ki Han Kim, Gyeonggi-do (KR); Hyun Woo Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 163 days.

(21) Appl. No.: 12/648,422

(22) Filed: Dec. 29, 2009

(65) Prior Publication Data

US 2011/0128059 A1    Jun. 2, 2011

(30) Foreign Application Priority Data

Nov. 30, 2009   (KR) .................... 10-2009-0117333

(51) Int. Cl.
*H03K 3/017* (2006.01)
(52) U.S. Cl. ........................ 327/175; 327/172
(58) Field of Classification Search ........... 327/172–175
See application file for complete search history.

(56) References Cited

U.S. PATENT DOCUMENTS

| | | | | |
|---|---|---|---|---|
| 5,757,218 A * | 5/1998 | Blum | ............................ | 327/175 |
| 6,208,169 B1 * | 3/2001 | Wong et al. | ...................... | 326/93 |
| 6,573,771 B2 | 6/2003 | Lee et al. | | |
| 6,603,339 B2 | 8/2003 | Atallah et al. | | |
| 6,853,225 B2 | 2/2005 | Lee | | |
| 6,963,235 B2 | 11/2005 | Lee | | |
| 7,015,739 B2 * | 3/2006 | Lee et al. | ....................... | 327/175 |
| 7,024,324 B2 * | 4/2006 | Rifani et al. | ..................... | 702/79 |
| 7,183,824 B2 * | 2/2007 | Park et al. | ........................ | 327/172 |
| 7,777,543 B2 * | 8/2010 | Park | .............................. | 327/175 |
| 7,791,388 B2 * | 9/2010 | Gomm | ........................ | 327/175 |
| 7,898,309 B1 * | 3/2011 | Dogan | ......................... | 327/175 |
| 2006/0091921 A1 * | 5/2006 | Park et al. | ...................... | 327/175 |
| 2006/0197565 A1 | 9/2006 | Kang | | |
| 2007/0001724 A1 * | 1/2007 | Na | ................................ | 327/158 |
| 2007/0046347 A1 * | 3/2007 | Lee | .............................. | 327/158 |
| 2009/0058481 A1 * | 3/2009 | Kim et al. | ...................... | 327/175 |
| 2009/0058483 A1 * | 3/2009 | Shin et al. | ...................... | 327/175 |

FOREIGN PATENT DOCUMENTS

| | | |
|---|---|---|
| JP | 2004-129255 A | 4/2004 |
| JP | 2004-220602 A | 8/2004 |
| JP | 2005-316722 A | 11/2005 |
| JP | 2006-060842 A | 3/2006 |
| KR | 1020080032972 A | 4/2008 |
| KR | 1020080075286 A | 8/2008 |

* cited by examiner

*Primary Examiner* — Ryan Jager
(74) *Attorney, Agent, or Firm* — Ladas & Parry LLP

(57) ABSTRACT

A duty correction circuit is presented for use in compensating for a duty rate error brought about when a malfunction of a clock signal generator or a failure of a signal transmission line occurs. The duty correction circuit is configured to select one of differential signals as an input signal according to a duty rate. The duty correction circuit is also configured to combine the input signal and a signal obtained by delaying the input signal by a delay time adjusted in accordance to the duty rate. The duty correction circuit is also configured to generate the combined signal as a duty correction signal.

12 Claims, 6 Drawing Sheets

US 8,154,331 B2

DUTY CORRECTION CIRCUIT

CROSS-REFERENCES TO RELATED APPLICATION

The present application claims priority under 35 U.S.C. §119(a) to Korean application number 10-2009-0117333, filed on Nov. 30, 2009, in the Korean Intellectual Property Office, which is incorporated herein by reference in its entirety as set forth in full.

BACKGROUND

1. Technical Field

The present invention relates to a semiconductor circuit technology, and more particularly, to a duty correction circuit.

2. Related Art

In a semiconductor circuit technology, e.g., a semiconductor memory apparatus, internal circuits operate in synchronization with an external clock signal.

It is ideal that a duty rate of a clock signal is 50%, that is, a high pulse duration is equal to a low pulse duration.

However, an error may occur in a duty rate of a clock signal when malfunction of a clock signal generator or failure of a signal transmission line occurs.

Consequently, there is a need for technology which can compensate a duty rate error of a clock signal inside a device which uses the clock signal, even though an error exists in a duty rate of an external clock signal.

SUMMARY

In one embodiment of the present invention, a duty correction circuit is configured to select one of differential signals as an input signal according to a duty rate, combine the input signal and a signal obtained by delaying the input signal by a delay time adjusted according to the duty rate, and generate the combined signal as a duty correction signal.

In another embodiment of the present invention, a duty correction circuit includes: a multiplexing block configured to select one of differential signals in response to a selection signal and output the selected differential signal as an input signal; a duty correction block configured to correct a duty of the input signal according to shift control signals and generate a duty correction signal; a duty detection block configured to detect a duty of the duty correction signal and generate a detection signal; a control block configured to generate the shift control signals according to the detection signal; and a selection signal generation block configured to generate the selection signal according to the detection signal.

BRIEF DESCRIPTION OF THE DRAWINGS

Features, aspects, and embodiments are described in conjunction with the attached drawings, in which.

DETAILED DESCRIPTION

Hereinafter, a duty correction circuit according to the present invention will be described below with reference to the accompanying drawings through preferred embodiments.

Figure 1:
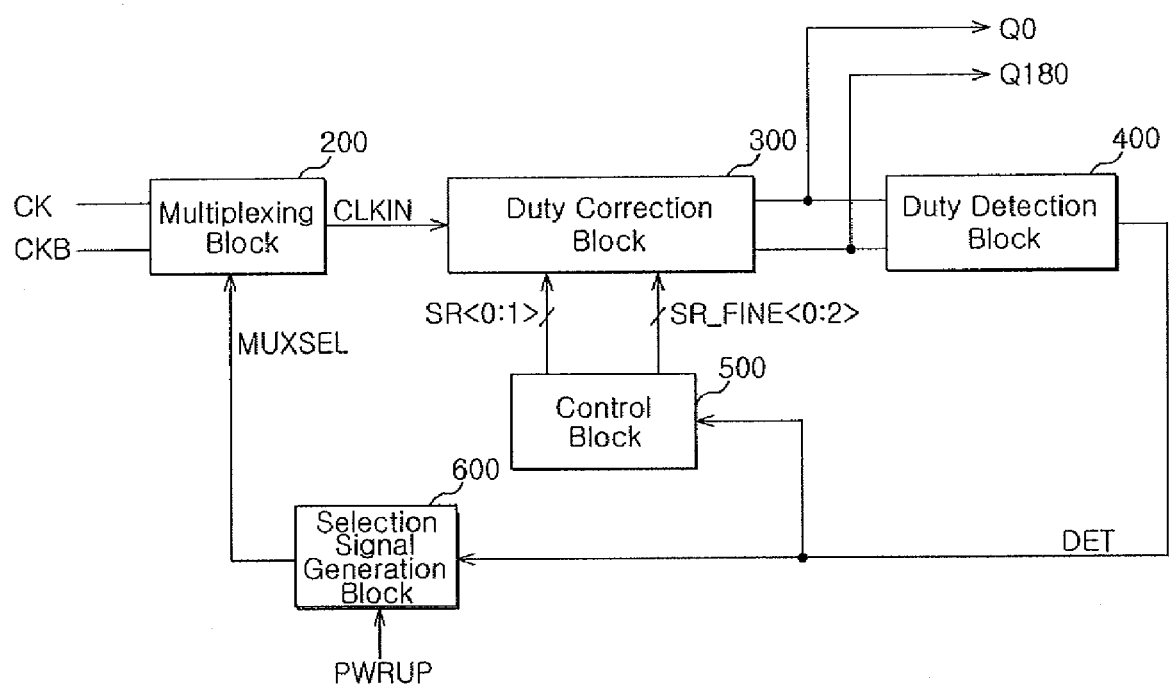
FIG. 1 is a block diagram of a duty correction circuit 100 according to one embodiment.

Referring to FIG. 1, a duty correction circuit 100 according to one embodiment includes a multiplexing block 200, a duty correction block 300, a duty detection block 400, a control block 500, and a selection signal generation block 600.

The multiplexing block 200 is configured to select one of a clock signal CK and a clock bar signal CKB in response to a selection signal MUXSEL and output the selected signal as an input clock signal CLKIN.

For example, the multiplexing block 200 may be configured to select the clock signal CK and output the selected clock signal CK as the input clock signal CLKIN when the selection signal MUXSEL is a high level, and select the clock bar signal CKB and output the selected clock bar signal CKB as the input clock signal when the selection signal MUXSEL is a low level.

The clock bar signal CKB is a signal having an opposite phase to the clock signal CK.

The duty correction block 300 is configured to correct a duty of the input clock signal CLKIN according to shift control signals SR<0:1> and SR_FINE<0:2> and configured to generate duty correction signals Q0 and Q180.

The duty correction signal Q180 is a signal having an opposite phase to the duty correction signal Q0.

The duty detection block 400 is configured to detect duties of the duty correction signals Q0 and Q180 and configured to generate a duty detection signal DET.

For example, the duty detection block 400 may be configured to output the duty detection signal DET of a high level when the high level duration of the duty correction signal Q0 is longer than the low level duration of the duty correction signal Q0, and configured to output the duty detection signal DET of a low level when the low level duration of the duty correction signal Q0 is longer than the high level duration of the duty correction signal Q0.

The duty detection block 400 may use an analog duty detection circuit or a digital duty detection circuit. For example, an analog duty detection circuit may be configured to integrate a difference in current amounts of two input signals, i.e., differential signals, and configured to output the detection signal DET.

The control block 500 is configured to generate the shift control signals SR<0:1> and SR_FINE<0:2> in response to the duty detection signal DET.

The selection signal generation block 600 is configured to generate the selection signal MUXSEL in response to a power-up signal PWRUP and the duty detection signal DET.

The selection signal generation block 600 is configured to latch an initial value of the duty detection signal DET and to output the latched initial value as the selection signal MUXSEL.

Figure 2:
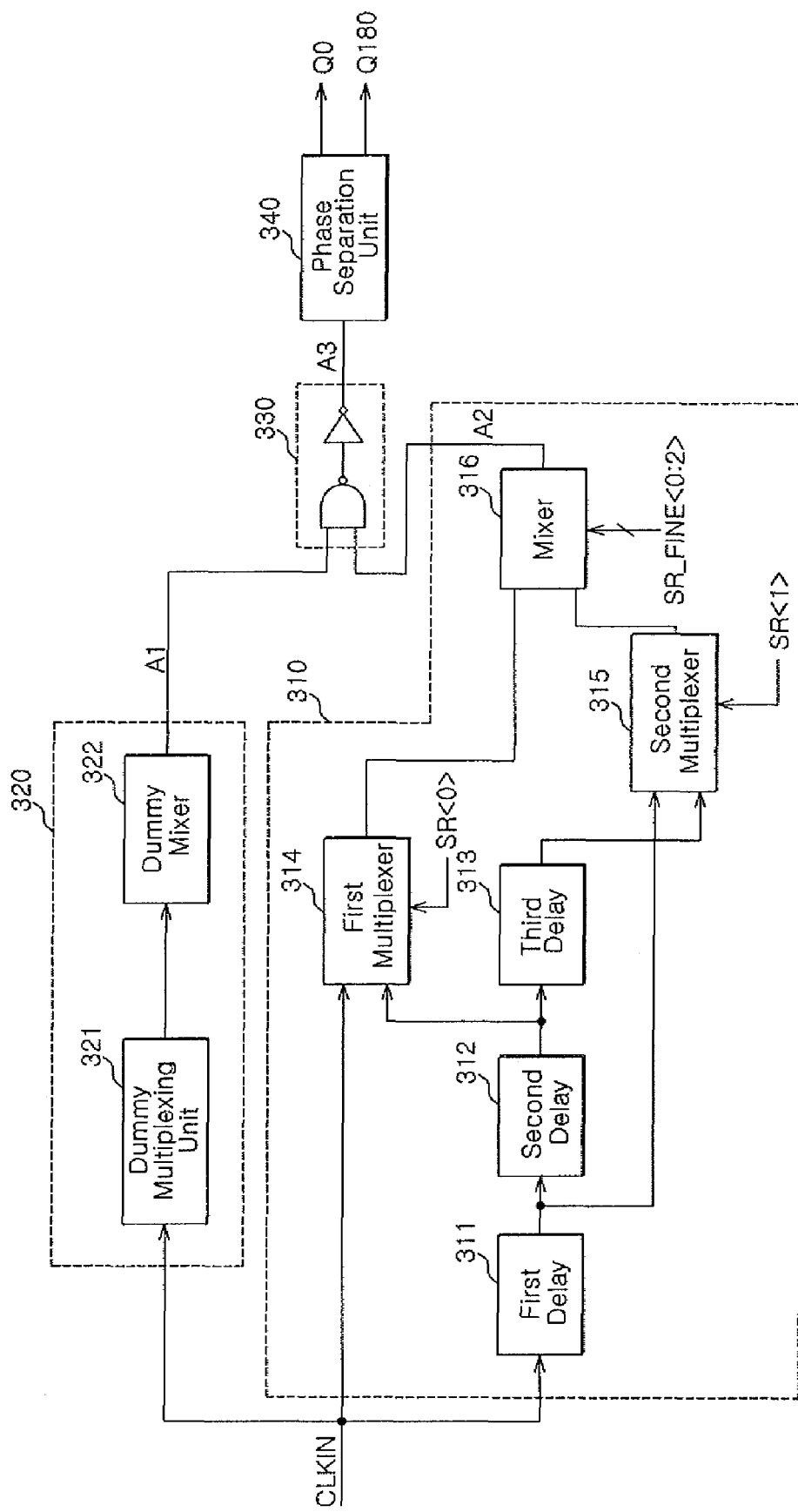
FIG. 2 is a block diagram illustrating the internal configuration of a duty correction block 300 of FIG. 1.

Referring to FIG. 2, the duty correction block 300 includes a delay line 310, a dummy circuit unit 320, a signal combination unit 330, and a phase separation unit 340.

The delay line 310 is configured to vary a delay time of the input clock signal CLKIN in accordance to the shift control signals SR<0:1> and SR_FINE<0:2> and configured to generate a second path signal A2.

The delay line 310 includes first through third delays 311 through 313, first and second multiplexers 314 and 315, and a mixer 316.

When the logic value of the shift control signal SR<0:1> is '10', the first multiplexer 314 selects the output signal of the second delay 312 and outputs the output signal of the second delay 312 to the mixer 316, and the second multiplexer 315 selects the output signal of the first delay 311 and outputs the output signal of the first delay 311 to the mixer 316.

On the other hand, when the logic value of the shift control signal SR<0:1> is '01', the first multiplexer 314 selects the input clock signal CLKIN and outputs the input clock signal to the mixer 316, and the second multiplexer 315 selects the output signal of the third delay 313 and outputs the output signal of the third delay 313 to the mixer 316.

That is, the delay time of the input clock signal CLKIN is adjusted in a wide range in accordance to the shift control signal SR<0:1>.

Meanwhile, the mixer 316 mixes the output signal of the first multiplexer 314 and the output signal of the second multiplexer 315, while applying a predefined weight value in accordance to the shift control signal SR_FINE<0:2>, and finely adjusts the delay time of the input clock signal CLKIN.

The mixer 316 increases the weight value for the output signal of the second multiplexer 315 in proportion to the increase in the logic value of the shift control signal SR_FINE<0:2>.

As the logic value of the shift control signal SR_FINE<0:2> increases, the mixer 316 applies a larger weight value to the second multiplexer 315 than the first multiplexer 314 and then mixes the output signal of the second multiplexer 315 and the output signal of the first multiplexer 314.

As described above, as the logic value of the shift control signal SR_FINE<0:2> increases, the mixer 316 increases the weight value for the second multiplexer 315. Consequently, when the shift control signal SR_FINE<0:2> has the maximum value "111", the output signal A2 of the mixer 316 is generated by applying the maximum weight value to the output signal of the second multiplexer 315.

The dummy circuit unit 320 is configured to delay the input clock signal CLKIN by a delay time corresponding to a signal processing delay of the delay line 310, and generate a first path signal A1.

The dummy circuit unit 320 includes a dummy multiplexer 321 and a dummy mixer 322.

The dummy multiplexer 321 is designed to have a delay time corresponding to a signal processing delay caused by the first multiplexer 314 and the second multiplexer 315, and the dummy mixer 322 is designed to have a delay time corresponding to a signal processing delay caused by the mixer 316.

Consequently, the dummy circuit unit 320 is designed so that the first path signal A1 has substantially the same timing as the second path signal A2, except for the delay time caused by the first through third delays 311 through 313.

The signal combination unit 330 is configured to perform an AND operation on the first path signal A1 and the second path signal A2 and to subsequently generate a combination signal A3 in which the duty of the input clock signal CLKIN is corrected.

The phase separation unit 340 is configured to separate the phase of the combination signal A3 and generate the duty correction signals Q0 and Q180.

The duty correction signal Q0 has a substantially equal phase to that of the combination signal A3, and the duty correction signal Q180 has a phase substantially opposite to that of the combination signal A3.

Figure 3:
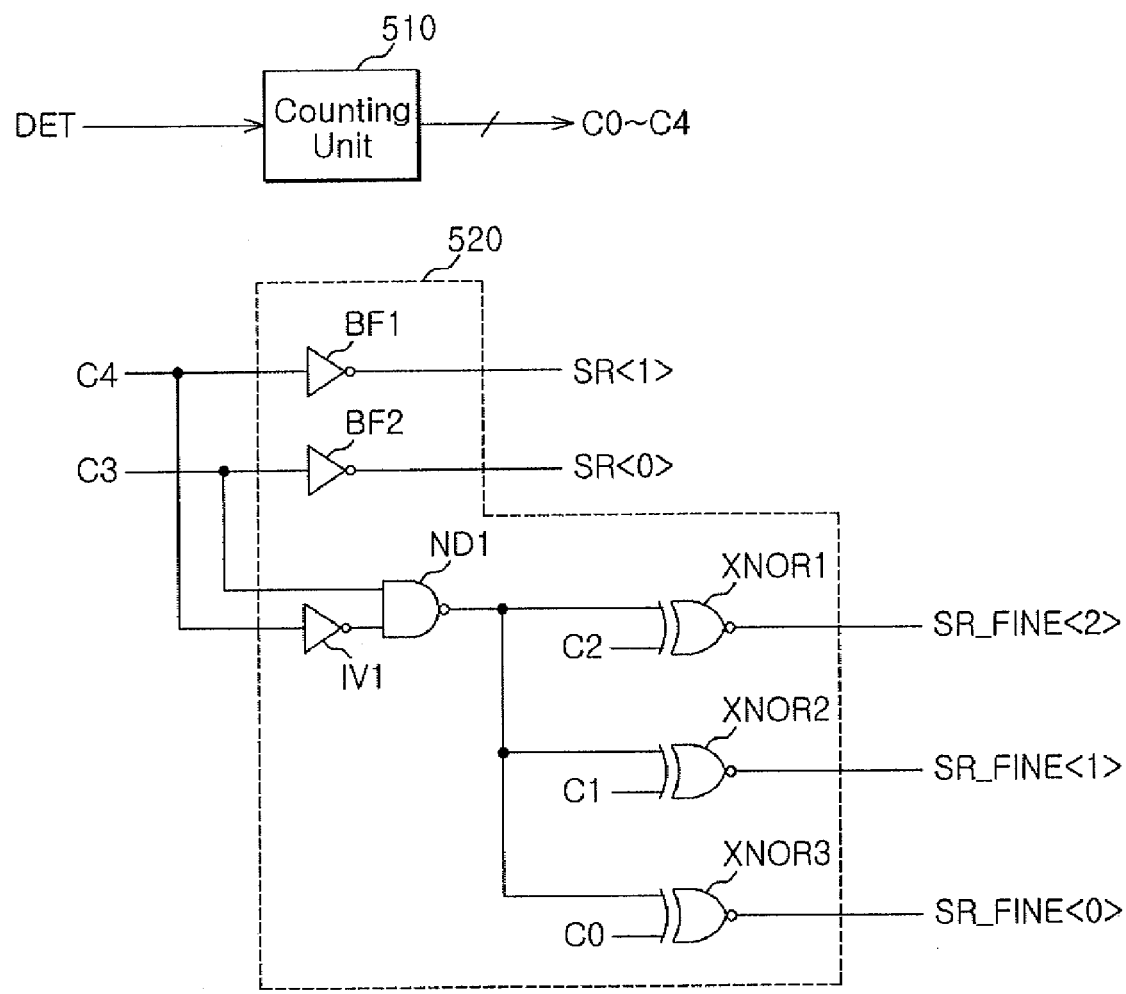
FIG. 3 is a circuit diagram of a control block 500 of FIG. 1.

Referring to FIG. 3, the control block 500 includes a counting unit 510 and a shift control signal generation unit 520.

The counting unit 510 is an up/down counter and is configured to generate count signals C0 through C4 according to the duty detection signal DET.

The counting unit 510 is configured to count the count signals C0 through C4 from the initial logic value "00000" according to the duty detection signal DET, and configured to increase or decrease the count signals C0 through C4. That is, when the duty detection signal DET is a high level, the counting unit 510 increases the count signals C0 through C4 in the order of '00000', '10000', '01000', . . . , and decreases the count signals C0 through C4 in the order of '01000', '10000', '00000', . . . .

The shift control signal generation unit 520 is configured to generate the shift control signals SR<0:1> and SR_FINE<0:2> using the count values C0 through C4.

The shift control signal generation unit 520 includes a plurality of buffers BF1 through BF2, an inverter IV1, a NAND gate ND1, and a plurality of XNOR gates XNOR1 through XNOR3.

The shift control signal generation unit 520 is configured to output the count signals C3 and C4 as the shift control signal SR<0:1> and output the count signals C0 through C2 as the shift control signal SR_FINE<0:2>.

In this case, the shift control signal generation unit 520 is configured to output the inverted signals of the count signals C0 through C2 as the shift control signal SR_FINE<0:2> when the logic value of the shift control signal SR<0:1>, i.e., the count signals C3 and C4, is '10'.

Referring to FIG. 2, when the logic value of the shift control signal SR<0:1> is '01', the first multiplexer 314 selects and outputs the output signal of the second delay 312, and the second multiplexer 315 selects and outputs the output signal of the first delay 311. That is, the delay value of the output signal of the first multiplexer 314 is is greater than the delay value of the output signal of the second multiplexer 315.

Meanwhile, in all cases, except for the case where the logic value of the shift control signal SR<0:1> is '10', the delay value of the output signal of the second multiplexer 315 is greater than the delay value of the output signal of the first multiplexer 314.

That is, when mixing the output signal of the first multiplexer 314 and the output signal of the second multiplexer 315 through the mixer 316, the case where the logic value of the shift control signal SR<0:1> is '10' applies the weight value opposite to the other cases.

Therefore, as illustrated in FIG. 3, the shift control signal generation unit 520 is configured using the inverter IV1, the NAND gate ND1, and the plurality of XNOR gates XNOR1 through XNOR3, so that the shift control signal SR_FINE<0:2> is generated by inverting the count signals C0 through C4 only in the case where the logic value of the shift control signal SR<0:1> is '10'.

Figure 4:
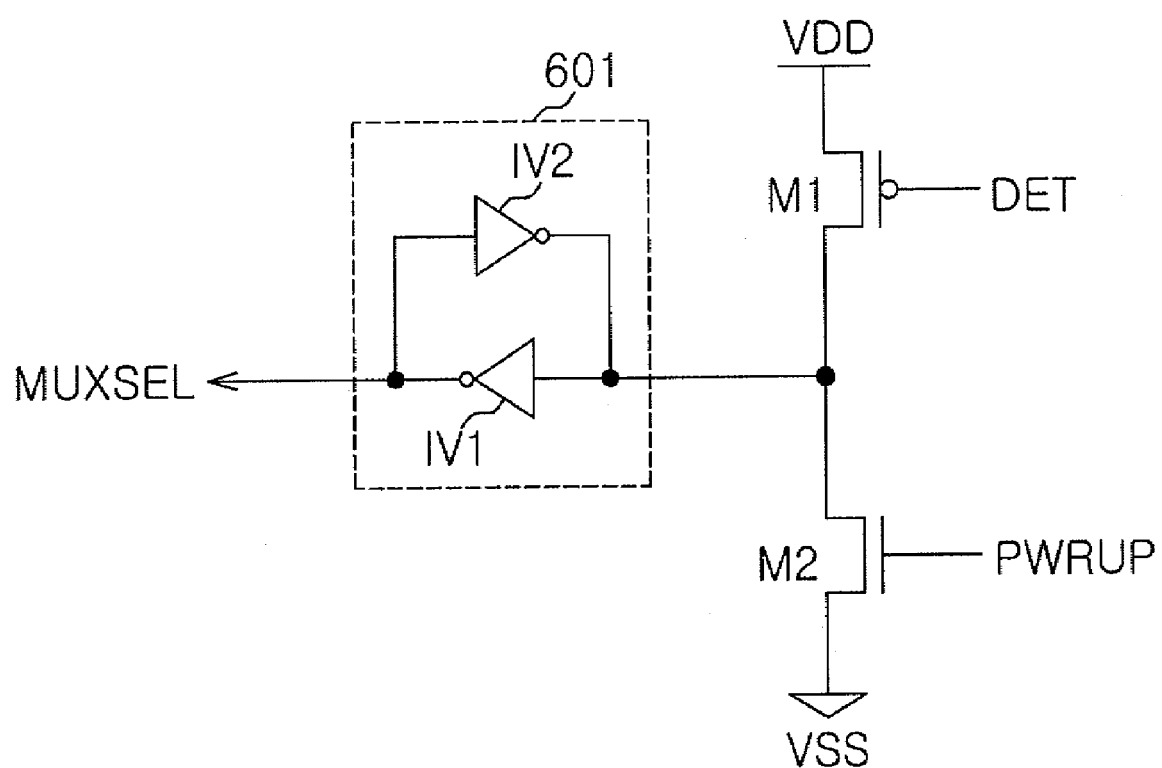
FIG. 4 is a circuit diagram of a selection signal generation block 600 of FIG. 1.

Referring to FIG. 4, the selection signal generation block 600 is configured to latch the selection signal MUXSEL of an initial level, e.g., a high level, in response to a power-up signal PWRUP, transit the selection signal MUXSEL to a low level in response to the duty detection signal DET at a low level, and latch the selection signal MUXSEL.

The selection signal generation block 600 may be configured with a latch 601 including first and second transistors M1 and M2 and first and second inverters IV1 and IV2.

The operation of the embodiment having the above-described configuration will be described below.

Figure 5:
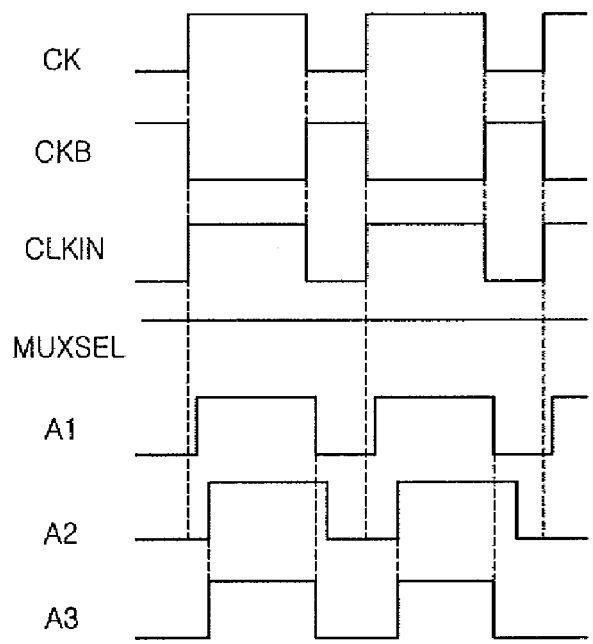
FIGS. 5 and 6 are timing diagrams illustrating the operation of the duty correction circuit 100 according to one embodiment.

First, the operation of the embodiment when the high level duration of the clock signal CK is longer than the low level duration of the clock signal CK will be described below with reference to FIG. 5.

The selection signal MUXSEL is in such a state that it is initialized to a high level by the initialization related signal of the semiconductor device to which the duty correction circuit 100 according to one embodiment is applied, e.g., a power-up signal PWRUP of a semiconductor memory.

The multiplexing block 200 selects the clock signal CK in accordance to the selection signal MUXSEL at a high level, and provides the selected clock signal CK to the duty correction block 300 as the input clock signal CLKIN.

The duty correction unit 300 performs an AND operation on the first path signal A1 and the second path signal A2 delayed by the delay time in accordance to the initial shift control signals SR<0:1> and SR_FINE<0:2>, separates the phase of the resulting signal, and generates the duty correction signals Q0 and Q180.

The duty detection block 400 outputs the detection signal DET in accordance to the difference of the current amount between the high level duration and the low level duration of the duty correction signals Q0 and Q180.

Since the high level duration of the duty correction signal is Q0 is longer than the low level duration of the duty correction signal Q0, the detection signal DET at the high level is outputted.

The control block 500 generates the shift control signals SR<0:1> and SR_FINE<0:2> in accordance to the detection signal DET at the high level.

Since the detection signal DET is the high level, the selection signal generation block 600 maintains the selection signal MUXSEL at the initial level, i.e., the high level.

Meanwhile, the internal delay time of the duty correction block 300 increases in accordance to the shifted shift control signals SR<0:1> and SR_FINE<0:2>. That is, the delay time of the second path signal A2 increases.

The duty rates of the duty correction signals Q0 and Q180 generated by separating the phase of the combination signal A3 generated through the repetition of the above-described operations are corrected to be gradually close to 50%.

Figure 6:
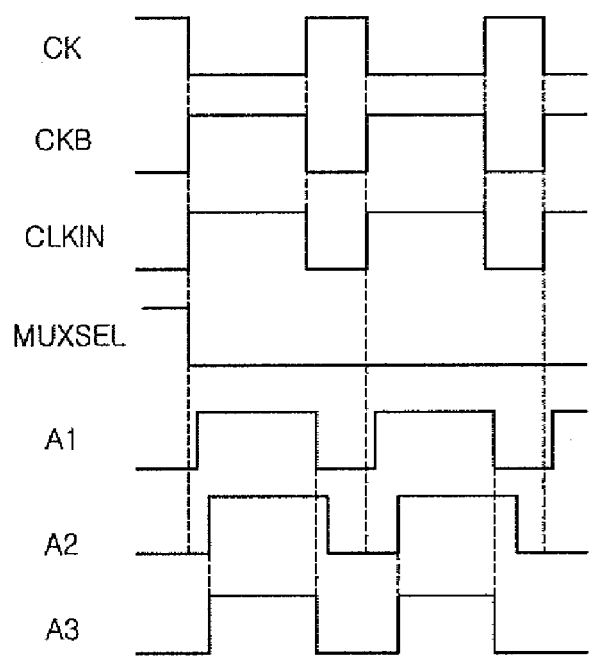

Next, the operation of the embodiment when the low level duration of the clock signal CK is longer than the high level duration of the clock signal CK will be described below with reference to FIG. 6.

The selection signal MUXSEL is in such a state that it is initialized to a high level by the initialization related signal of the semiconductor device to which the duty correction circuit 100 according to one embodiment is applied, e.g., a power-up signal PWRUP of a semiconductor memory.

The multiplexing block 200 selects the clock signal CK in accordance to the selection signal MUXSEL at a high level, and provides the selected clock signal CK to the duty correction block 300 as the input clock signal CLKIN.

The duty correction unit 300 performs an AND operation on the first path signal A1 and the second path signal A2 delayed by the delay time in accordance to the initial shift control signals SR<0:1> and SR_FINE<0:2>, separates the phase of the resulting signal, and generates the duty correction signals Q0 and Q180.

The duty detection block 400 outputs the detection signal DET in accordance to the difference of the current amount between the high level duration and the low level duration of the duty correction signals Q0 and Q180.

Since the low level duration of the duty correction signal Q0 is longer than the high level duration of the duty correction signal Q0, the detection signal DET of the low level is outputted.

Since the detection signal DET is the low level, the selection signal generation block 600 transits the selection signal MUXSEL at a low level and latches the transited selection signal MUXSEL.

The multiplexing block 200 selects the clock bar signal CKB in accordance to the selection signal MUXSEL of the low level and to provides the clock bar signal CKB to the duty correction block 300 as the input clock signal CLKIN.

The duty correction block 300 performs the AND operation on the first path signal A1 and the second path signal A2 delayed by the delay time in accordance to the initial shift control signals SR<0:1> and SR_FINE<0:2>, separates the phase of the resulting signal, and generates the duty correction signals Q0 and Q180.

Since the duty correction signal Q0 is generated by the clock bar signal CKB, the high level duration is longer than the low level duration. Therefore, the duty detection block 400 outputs the detection signal DET at the high level.

The control block 500 generates the shift control signals SR<0:1> and SR_FINE<0:2> in accordance to the detection signal DET of the high level.

Since the detection signal DET is the high level, the selection signal generation block 600 maintains the selection signal MUXSEL at the high level.

Meanwhile, the internal delay time of the duty correction block 300 increases in accordance to the shifted shift control signals SR<0:1> and SR_FINE<0:2>. That is, the delay time of the second path signal A2 increases.

The duty rates of the duty correction signals Q0 and Q180 generated by separating the phase of the combination signal A3 generated through the repetition of the above-described operations are corrected to be gradually close to 50%.

Consequently, in this embodiment, the duty correction is performed using the clock signal CK when the high level duration of the clock signal CK is longer than the low level duration of the clock signal CK, and the duty correction is performed using the clock bar signal CKB when the low level duration of the clock signal CK is longer than the high level duration of the clock signal CK.

Therefore, by increasing the delay value of the second path signal A2, without regard to the duty rate of the clock signal CK, the duty rate correction is achieved through only the circuit configuration which performs the AND operation on the first path signal A1 and the second path signal A2.

Figure 7:
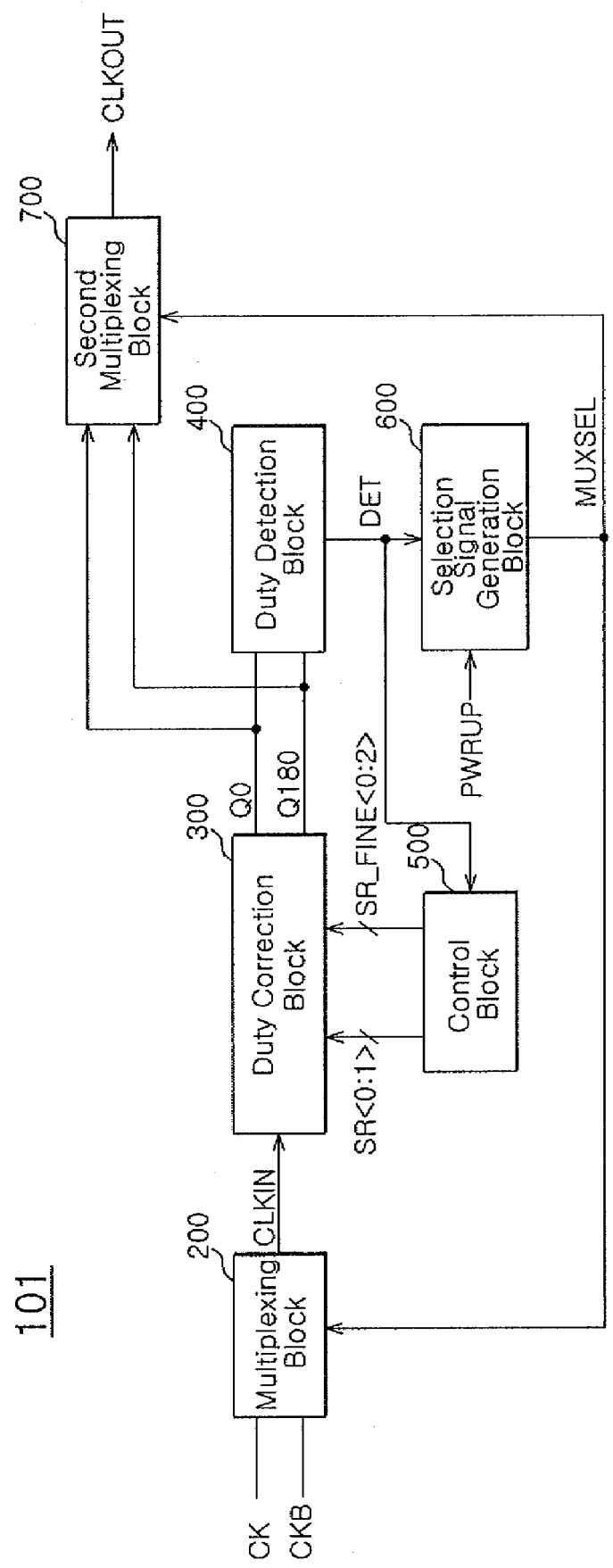
FIG. 7 is a block diagram of the duty correction circuit 101 according to another embodiment.

A duty correction circuit 101 of FIG. 7 according to another embodiment may be implemented with the same configuration as the duty correction circuit of FIG. 1 according to one embodiment, except that a second multiplexing block 700 is added.

The second multiplexing block 700 is configured to select one of the duty correction signals Q0 and Q180 in accordance to the selection signal MUXSEL and output the selected signal as a final output signal CLKOUT.

That is, when the low level duration of the clock signal CK is longer than the high level duration of the clock signal CK, then the duty correction signals Q0 and Q180 are generated using the clock bar signal CKB. Hence, the phases of the duty correction signals Q0 and Q180 are opposite to the phases of the clock signal CK and the clock bar signal CKB, respectively.

Therefore, when the selection signal MUXSEL has a level selecting the clock bar signal CKB, i.e., a low level, then the duty correction signal Q180 of the duty correction signals Q0 and Q180 is selected and outputted as the final output signal CLKOUT.

While certain embodiments have been described above, it will be understood to those skilled in the art that the embodiments are described by way of example only. Accordingly, the duty correction circuit described herein should not be limited based on the described embodiments. Rather, the duty correction circuit described herein should only be limited in light of the claims that follow when taken in conjunction with the above description and accompanying drawings.

What is claimed is:

1. A duty correction circuit configured to combine an input signal and a signal obtained by delaying the input signal by a delay time to generate a duty correction signal and configuerd to select one of differential signals as the input signal according to a duty rate of the duty correction signal, wherein the delay time is adjusted according to the duty rate.

2. The duty correction circuit according to claim 1, wherein the differential signals comprise a clock signal and a clock bar signal having an opposite phase to the clock signal.

3. The duty correction circuit according to claim 1, wherein the input signal comprises one of the differential signals which has a high level duration longer than a low level duration.

4. The duty correction circuit according to claim 1, wherein the duty correction circuit is configured to perform an AND operation on the input signal and the signal obtained by delaying the input signal by the delay time adjusted in accordance to the duty rate, and configured to generate the combined signal as the duty correction signal.

5. A duty correction circuit comprising:
a multiplexing block configured to select one of differential signals in response to a selection signal and to output the selected differential signal as an input signal;
a duty correction block configured to generate a duty correction signal by correcting a duty of the input signal in accordance to shift control signals;
a duty detection block configured to generate a detection signal by detecting a duty rate of the duty correction signal;
a control block configured to generate the shift control signals in accordance to the detection signal; and
a selection signal generation block configured to generate the selection signal in accordance to the detection signal.

6. The duty correction circuit according to claim 5, wherein the duty correction block is configured to combine the input signal and a signal obtained by delaying the input signal by a delay time corresponding to the shift control signals, and configured to generate the duty correction signal.

7. The duty correction circuit according to claim 5, wherein the duty correction block comprises:
a signal line configured to transmit the input signal as a first path signal;
a delay line configured to delay the input signal by a delay time corresponding to the shift control signals, and output the delayed input signal as a second path signal;
a signal combination block configured to generate a combination signal by combining the first path signal and the second path signal; and
a phase separation block configured to generate the duty correction signal by separating a phase of the combination signal.

8. The duty correction circuit according to claim 7, wherein the signal combination block is configured to perform an AND operation on the first path signal and the second signal, and configured to generate the combination signal.

9. The duty correction circuit according to claim 7, further comprising a dummy circuit block connected to the signal line and configured to delay the input signal by a signal processing time of the delay line, except for the time corresponding to the shift control signals.

10. The duty correction circuit according to claim 5, wherein the duty detection block is configured to detect a difference of an electric current amount between a first signal and a second signal having an opposite phase to the first signal, and configured to generate the detected difference of the electric current amount as the detection signal.

11. The duty correction circuit according to claim 5, wherein the selection signal generation block is configured to latch the selection signal as an initial value in response to a power-up signal, configured to transit the selection signal to a different level from the initial value in response to a duty detection signal, and configured to latch the transited selection signal.

12. The duty correction circuit according to claim 5, further comprising a second multiplexing block configured to select one of the duty correction signals in accordance to the selection signal and configured to output the selected duty correction signal as a final output signal, the duty correction signals comprising a first signal and a second signal having an opposite phase to the first signal.

* * * * *